United States Patent [19]
Valdenaire

[11] Patent Number: 5,455,582
[45] Date of Patent: Oct. 3, 1995

[54] DIGITAL TO ANALOG CONVERTER EMPLOYING R-2R LADDERS WITH SUBSTITUTED SHUNT ARMS

[75] Inventor: Patrick Valdenaire, Valbonne, France

[73] Assignee: ULSI Technology, Inc., San Jose, Calif.

[21] Appl. No.: 992,338

[22] Filed: Dec. 17, 1992

[51] Int. Cl.⁶ .................................................. H03M 1/78
[52] U.S. Cl. ................................. 341/154; 341/144
[58] Field of Search ........................ 341/154, 153, 341/127, 143, 138, 156, 145, 144

[56] References Cited

U.S. PATENT DOCUMENTS

| | | | |
|---|---|---|---|
| 3,495,235 | 2/1970 | Ottesen | 341/165 X |
| 3,588,882 | 6/1971 | Propster | 341/153 X |
| 4,323,885 | 4/1982 | Carriere et al. | 341/127 X |
| 4,381,499 | 4/1983 | Struthoff | 341/154 |
| 4,494,107 | 1/1985 | Kearns et al. | 341/145 |
| 4,661,802 | 4/1987 | Yukawa | 341/150 |
| 4,683,458 | 7/1987 | Hallgren | 341/154 |

FOREIGN PATENT DOCUMENTS

WO90/16114  12/1990  European Pat. Off. .

Primary Examiner—Howard L. Williams
Attorney, Agent, or Firm—Andrew Horton

[57] ABSTRACT

A digital-to-analog converter of the R/2R ladder type is composed of two individually asymmetric ladders symmetrically coupled to a differential amplifier. Switch means in the shunt arms of the ladders are controlled so that the same number of shunt arms are connected to each of a pair of input or output nodes irrespective of the value of the controlling digital signal. The most significant shunt arm in each ladder may be configured as an equivalent of that part of the respective ladder extending from the respective stage node towards the least significant end of the ladder.

7 Claims, 5 Drawing Sheets

DIGITAL TO ANALOG CONVERTER EMPLOYING R-2R LADDERS WITH SUBSTITUTED SHUNT ARMS

This invention relates to the conversion of digital to analog signals using R/2R digital to analog converters, otherwise termed multiplying digital to analog converters, and is particularly concerned with improving the linearity of conversion of such converters.

BACKGROUND TO THE INVENTION

R/2R digital to analog converters are well established for use in electrical circuits and particularly integrated circuits. They are simple in arrangement and can be realised to employ relatively few components and types of component having regard to the accuracy of conversion. They have inherently current switching, can be readily adapted for voltage switching and can readily be made bi-directional in operation so as to permit 2 or 4 quadrant operation.

The state of the art in relation to such converters is represented by international patent application serial number PCT/EP90/00912, (published as W090/6114).

R/2R digital to analog converters are particularly suitable for bi-polar realisation. However, the effectiveness of R/2R converters is dependent upon a precise 2:1 ratio between the impedance of a shunt arm and the impedance of a series arm. The shunt arms include a switch arrangement which is controlled by a respective component or digit of the digital signal to determine whether or not an output signal contains a component corresponding to the respective component or digit. In a normal arrangement each binary digit of the digital signal controls a switch arrangement in a respective shunt arm, such that each binary digit which is unity is represented by an appropriately scaled component of an output current, provided that, at each series node of the ladder, the impedance of the shunt arm is exactly equal to the effective series impedance presented to that node. Ideally, the switch arrangements should be composed of switches which have zero resistance when conductive, infinite impedance when non-conductive and a rapid switching time between conductive and non-conductive states. In practice, excellent switching can be achieved in a bi-polar realisation, wherein the switches in the shunt arms can be realised with a very low conductive resistance, a sufficiently rapid switching time and very low leakage when turned off. However, if the circuit is realised as an integrated circuit or part of an integrated circuit wherein the switches have a substantial resistance when conductive, the R/2R converter is less satisfactory. CMOS switches in particular have a substantial resistance when conductive, at least when normal sizes of transistor are used. Furthermore, the conductive resistance of a CMOS switch is strongly dependent upon both the voltage across the switch and the potential of the switch.

It has hitherto been proposed to compensate for these disadvantages in two general ways. One technique is to increase the passive resistances, that is to say the resistors in the series and shunt arms, so that the switch resistances are negligible in comparison to those of the resistors. Such a technique requires a large size of switch and is not satisfactory because the switches exhibit excessive parasitic impedances and operate only slowly owing to the high impedance level. A further method is to employ dummy switches, which are physically similar to the shunt switches in the series arms but which are arranged to be, effectively, permanently conductive. CMOS switches can easily be scaled in integral ratios and accordingly where a shunt switch has an aspect ratio or channel ratio of W/L, a dummy switch having a channel ratio of 2W/L, or a pair of dummy switches in parallel having a combined channel ratio of 2W/L, can be provided in the corresponding shunt arm. Alternatively the shunt switch arrangement may consist of two similar switches in series, all the switches having a channel ratio of 2W/L. In these several ways it is possible to compensate for the substantial resistance of the switches. However, none of the aforementioned techniques properly compensates for the differential non-linearity arising from the dependence of the conductive resistance of the switches on their terminal voltages.

SUMMARY OF THE INVENTION

One object of the invention is to provide an R/2R digital to analog converter in which the effects of differential non-linearity are substantially reduced.

A further object of the invention is to provide for an R/2R a differential configuration which enables a generally improved performance for the converter.

A further object of the invention is to provide for an R/2R converter a configuration which facilitates the incorporation of a converter into a filter structure.

One feature of the invention is the provision of a converter wherein two R/2R converters are configured so that they are differentially energised and provide outputs which are or can be differentially combined.

An additional or alternative feature of the invention is the substitution of a shunt arm of an R/2R converter by an equivalent of the network seen from the respective node.

Other objects and features of the invention will become apparent from a consideration of the specific description with reference to the accompanying drawings.

DETAILED DESCRIPTION OF THE INVENTION

Figure 1:
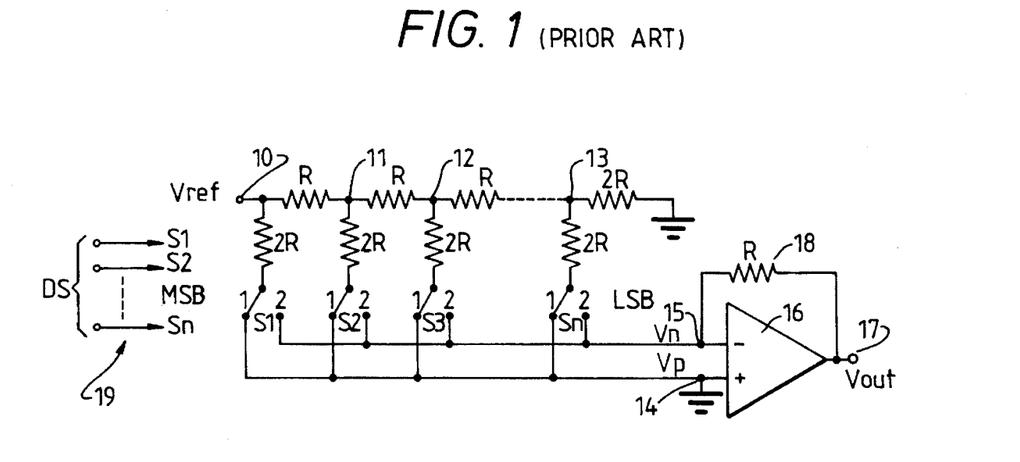
FIG. 1 is a schematic of a known form of R/2R digital to analog converter.

FIG. 1 illustrates a known form of R/2R ladder converter of digital signals into analog signals. Although FIG. 1 does not represent the only arrangement, it illustrates the operation of an R/2R converter in a simple way. An input node 10 of a ladder network having series arms and shunt arms receives a signal Vref. A series resistance R is disposed between each successive pair of nodes 10,11; 11,12 etc of the ladder network and a final node 13 of the network is connected by a terminating resistance 2R to earth. Each of the shunt arms -comprises a resistor 2R, which is connectable by a respective one of the switches S1,S2 etc to one or other of the nodes 14 and 15 (also designated Vp and Vn respectively). Each switch S1 may be realized as a pair of CMOS switches operated in a complementary manner from a respective digit of a multi digit digital signal. It is usual for the switch S1 to be operated in accordance with the most significant bit of the digital signal and for the switch Sn, at the other end of the ladder, to be operated in accordance with the least significant bit. The node 14(Vp) is earthed and also coupled to the non-inverting input of an operational amplifier 16 of which the inverting input is coupled to the node 15(Vn) and of which the output is coupled to an output terminal 17 connected by way of a feedback resistor 18, of resistance R, to the node 15.

A means 19 for controlling the switches in accordance with the digital signal is illustrated schematically by the input control lines DS coupling each switch S1 to Sn for control by a respective bit of the input digital signal. This means has been omitted from later Figures for the sake of convenience.

The principle of operation is straightforward. The node 14(Vp) is grounded and the node 15(Vn) is a virtual ground owing to the closed loop operation of the operational amplifier and therefore the current flow in the resistive network is established in a simple progression of powers of 2. Thus, as one progresses rightwards along the ladder, the currents which flow in the shunt branches are respectively one half, one quarter (and so on) of the current entering the ladder network by the node 10. The network is iterative, i.e. the equivalent resistance presented by the ladder network to any node 10 is R. On the convention that when the code zero is applied to a switch the respective shunt resistor is connected to the left hand pole (1) as shown in FIG. 1 and that when '1' is applied to the switch the resistor is connected to the pole 2, when the controlling digital signal is all zeros, the output node 15 is a potential ground and when the controlling digital signal is constituted by all ones, then Vout is $-Vref*(1-\frac{1}{2}^n)$, where n is the number of sections.

It should be remarked that it is not necessary for Vref to be applied to the terminal 10 and for the output to be taken from the nodes 14 and 15. For example, the nodes 14 and 15 maybe coupled to reference potentials, of which one may be ground potential, and a current output may be taken from the node 10. The embodiments described hereinafter may be modified likewise.

In most applications, the digital to analog converter is operated in a current mode so that the operational amplifier effectively performs a current-to-voltage conversion.

As mentioned previously, although R/2R converters are normally excellent when the switches are realised in bi-polar form, their performance when for example CMOS switches are used is much worse, by virtue of the substantial resistance of the switches when they are conductive and the dependence of that resistance on the switches' terminal voltages. By increasing the channel width of the transistors it is possible to lower the 'on' resistance but the adverse effect is an increase of parasitic components, resulting in excessive loads on the output of the digital analog converter, limiting the available conversion speed. Furthermore, the 'on' resistance of complementary switches is very voltage dependent and this characteristic limits the accuracy of the converter. The obvious ways to compensate for variations in conductive resistance are not sufficient to correct step size errors at transitions of the most significant bit of the controlling digital signal.

As is well known, an analog CMOS switch may be realised simply by connecting two transistors, a PMOS transistor and an NMOS transistor, in parallel, their gates being controlled by logic signals of opposite polarities. Both transistors normally operate at a small drain-to-source potential difference, and are not saturated in normal operation. The output conductances Gp and Gn for the p-type transistor and the n-type transistor are each approximately proportional to the respective channel ratio W/L, carrier mobility Wo and the difference between Vgs (the gate-source voltage) and the respective transition voltage Vtp or Vtn. The conductance of the switch is G=Gp+Gn.

Figure 2A:
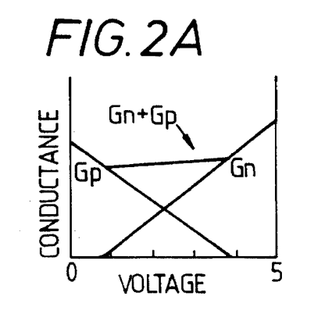
FIG. 2A and FIG. 2B are graphs which indicate the variation of conductance and resistance respectively of a CMOS switch.

FIG. 2A illustrates the variation of the conductances Gp and Gn with terminal voltage. The conductance Gp steadily decreases with increasing terminal voltage and the conductance Gn gradually increases. To a first order approximation, each of the terms depends linearly upon the potential difference which is applied to the switch, namely the common source-drain voltage.

Figure 2B:
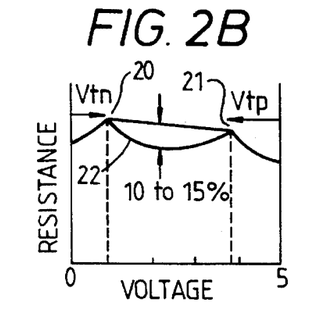

It appears possible theoretically to balance the switch to have a nearly constant conductance by choosing the channel ratios in inverse proportion to the carrier mobility. However, the constant conductance can be maintained only for a region wherein both transistors are conductive. As is shown in FIG. 2B, this region is from Vtn, the threshold voltage for the n-type transistor, to Vdd-Vtp, the drain line potential less the threshold voltage for the p-type transistor. Second, the exact computation for the proportional relationship between the n-type and p-type channel ratios has to account for the values of Vtp and Vtn and is rather more complex. It is possible to find an optimal ratio that provides a constant output conductance for the switch provided that the conductance of each switch follows a linear dependency.

However, owing to a variety of physical effects, the conductance of transistors does not follow the simple law described above. Among these effects are the degradation of mobility with vertical field, causing a reduction of conductance for large gate-source voltages. A body effect causes threshold variations and causes an increase of Vtp or Vtn with respect to variation in Vbs. A simulation (using for example a Spice simulator) shows a strong dependency of conductance upon the terminal voltage. A typical curve 20 of resistance against terminal voltage is shown in FIG. 2B. It has two local maxima 20 and 21 near Vtn and (Vdd-Vtp). In the range between these maxima there is a region 22 wherein the conductance can be as much as 10–15% lower than the local maxima. It is at least theoretically possible to scale the channel ratios to make the two local maxima equal but there is no means of correcting for the presence of the minimum between the two maxima, and the resolution of an R/2R ladder converter which employs CMOS switches is correspondingly degraded.

Although the foregoing commentary concerns CMOS devices specifically, the invention is also applicable when an R/2R converter is to be realized using other types of switch of which the 'on' or conductive impedance (i.e. conductance) is substantial and particularly when that conductance depends on the terminal voltage of the switch.

Figure 3:
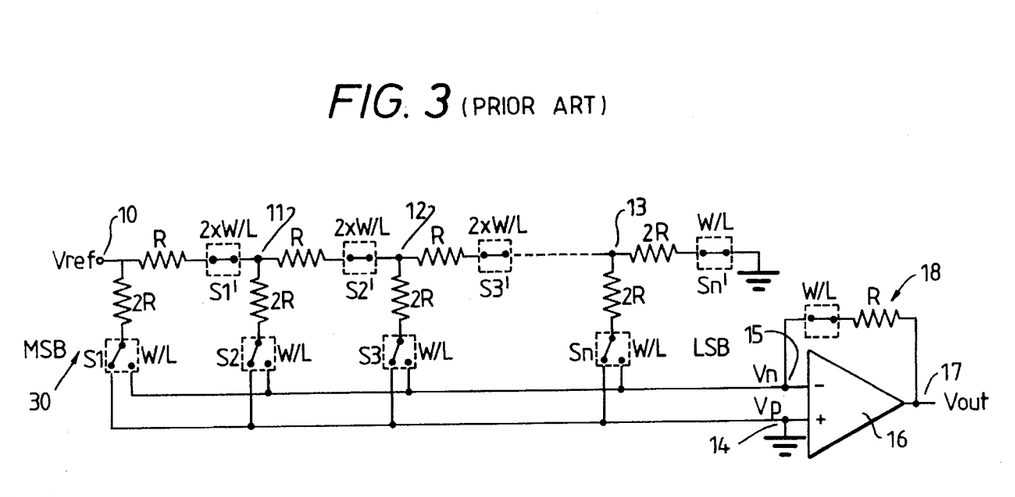
FIG. 3 illustrates a known form of R/2R converter.

Because CMOS switches can be easily scaled in integral ratios such as 2:1, it is possible to insert a dummy switch having an on resistance of Ron for the series branches and an operative switch having a conductive resistance of 2Ron for the shunt branches. This is illustrated in FIG. 3, which illustrates a converter similar to that shown in FIG. 1 but including dummy switches Si' etc in each of the series arms. The switches S1 have a channel ratio of W/L and are matched by the dummy switches, that is to say switches which are normally always conductive during operation, having a channel ratio of 2W/L. These dummy switches realized as two parallel switches each of which is identical to the unit switch S1 in parallel. Alternatively one may realize the switch S1 as two unit switches, each of channel ratio 2W/L, in series. Both these techniques can be made independent of edge effects and it is possible using the known technique illustrated by FIG. 3 to obtain acceptable digital to analog conversion for 6-bit and even 7-bit conversions.

It might be thought that by moving the corresponding switches close to one another on the series and shunt branches, to bring their terminal voltages closer, one could expect to improve quite substantially the linearity of the converter. This approach corrects the absolute effects created by the series resistance of the switches but will only be satisfactory if the switches have constant conductance. As has been explained with reference to FIGS. 2A and 2B however, CMOS switches do not have constant conductance and the residual variation may be as much as 15%.

One effect of the mismatch between the series (R) branches and the shunt (2R) branches is an excessive step value at the transition of a most significant bit of the digital signal controlling the switches. This is a differentially non-linear term and it is directly related to the matching of the first or leftmost shunt branch to the equivalent impedance (at node 10) of the rest of the ladder. Although other differentially non-linear errors can occur at for example the transitions of the second most significant bit, these errors are inherently less important.

With reference to FIG. 3, all the shunt switches S1 to Sn are adjacent ground potential and have equal resistance. However, the switches S1', S2' etc are adjacent different potentials, namely a half, a quarter, and so on of the reference potential Vref at the node 10. These potentials therefore rapidly approach the common ground potential. With reference to FIG. 2B, it is clear that the switch S1' will present the highest difference in resistance and will affect the digital-to-analog conversion the most because it affects the ratio of the shunt and series impedances presented to the most significant node 10 of the ladder network. Moreover, as one progresses along the ladder, the terminal voltages at the switches become closer to ground and the switch resistances converge to the same value; accordingly the errors except for the most significant may be neglected.

According to one aspect of the invention, the effect of any difference between the resistances of the switches S1 in the most significant shunt arm and the corresponding dummy switch S1' in the series arm may be effectively cancelled by substituting for the shunt arm an equivalent network corresponding to that to the right or less significant side of the most significant node 10.

Figure 4:
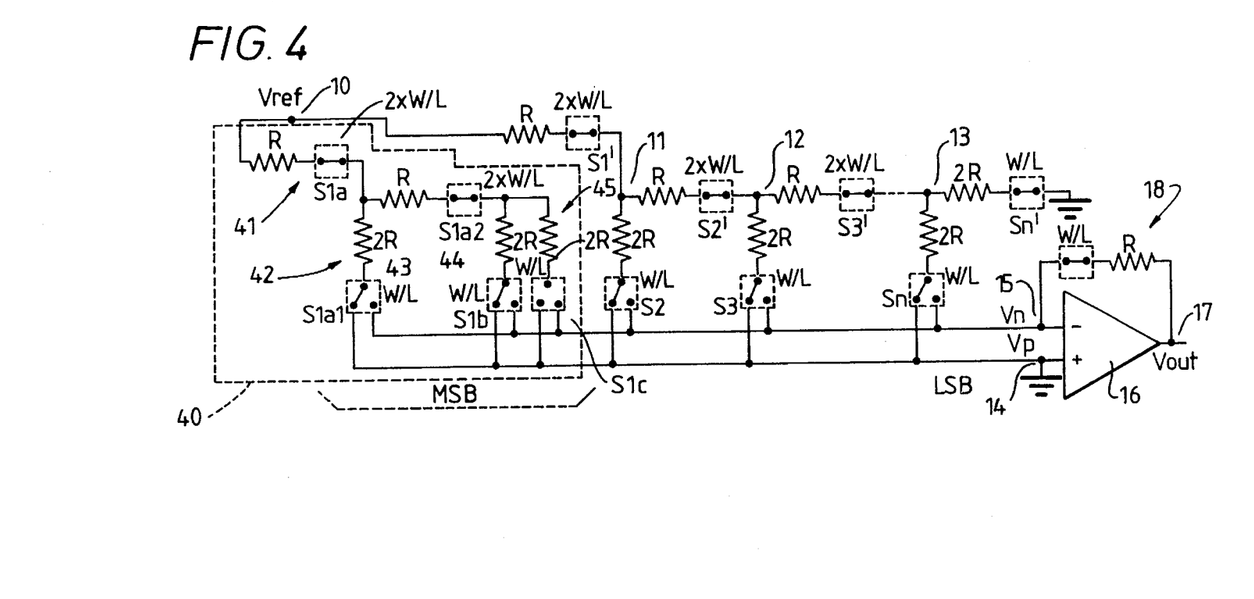
FIG. 4 illustrates one embodiment of an R/2R converter according to one aspect of the invention.

This scheme is shown in the embodiment illustrated in FIG. 4. The R/2R ladder network shown here is the same as that of FIG. 3 except that the first or most significant shunt arm 30 in that Figure has been substituted by a network 40 which is equivalent to the rest of the ladder network to the right of node 10 in FIG. 3. The equivalent network thus comprises a series arm 41 including an R resistor and a dummy switch S1a, of channel ratio 2W/L corresponding to the switch S1', a shunt arm 42 including a 2R resistor and a switch S1a1 having a channel ratio W/L, corresponding to switch S1, a second series arm 43 and subsequent shunt arms 44 and 45 in parallel, such that (i) the input impedance of this equivalent network is (R+Ron) where Ron is the on resistance of the switch S1'; and (ii) any subsequent series arm is similar and each shunt arm includes a 2R resistor and a switch of channel ratio W/L, i.e. having a resistance of 2Ron so that each shunt arm has an impedance of 2(R+Ron). In this scheme, the switch S1', which is the main cause of the differential error, is matched by the switch S1a, which is similarly disposed relative to the node 10 as is the switch S1'. Thus these two switches are, by the similarity of the main ladder and the equivalent ladder network substituting for the first shunt arm, similarly disposed relative to the most significant node of the converter and the variation of the resistance of the switch S1' with terminal voltage is nullified.

The effect of terminal voltage variation on the conductance of the switch S2' in the series arm of the second most significant section is compensated in this scheme by the dummy switch S1a2. Accordingly, the dominant part of the much reduced differential error is due to the series dummy switch S3' in the third section. The scheme may be extended to compensate for the effect of switch S3' and subsequent switches if desired.

The scheme shown in FIG. 4 is typically adequate to decrease differential non linearity at mid scale to less than approximately 1.4 times the least significant bit for an 8-bit digital to analog converter assuming resistance variations of up to 15%, the ratio of the passive resistors to the switch resistance (R/Ron) being below 50.

However, this scheme can be adapted to a variety of different configurations and the optimum number of arms that have to be added will be affected by the resistor/switch resistance ratio and the variation of the conductive resistance over the working range of voltage.

The scheme described with reference to FIG. 4 introduces partial symmetry into the asymmetrical ladder, the series and shunt impedances at node 10 being configured in a manner which is symmetrical at least as far as the most significant section is concerned. This concept of symmetry is further developed in the aspect of the invention to be described with reference to FIG. 5.

The output impedance on any of the output nodes of the converter is not constant and is strongly dependent upon the particular value of the controlling binary code. It may be seen that when all switches are positioned to the left (as shown in FIG. 4) the equivalent impedance on the nth node is virtually infinite because no current source is connected, whereas the impedance at the node 15(Vp) is the equivalent of all the sources (R+Rswitch). When all switches are in the other state, the converse is true. At first sight this may not appear to be of major importance for the converter because the output current from the digital to analog converter is converted to a voltage and because the node Vn is at virtually ground potential. However, it is often desirable to provide some additional signal shaping such as filtering of the output signal and this must be achieved at the expense of one or more additional amplifiers in addition to that which is used for conversion from current signals to voltage signals. By using a differential configuration for the convertor this further problem may be solved.

Figure 5:
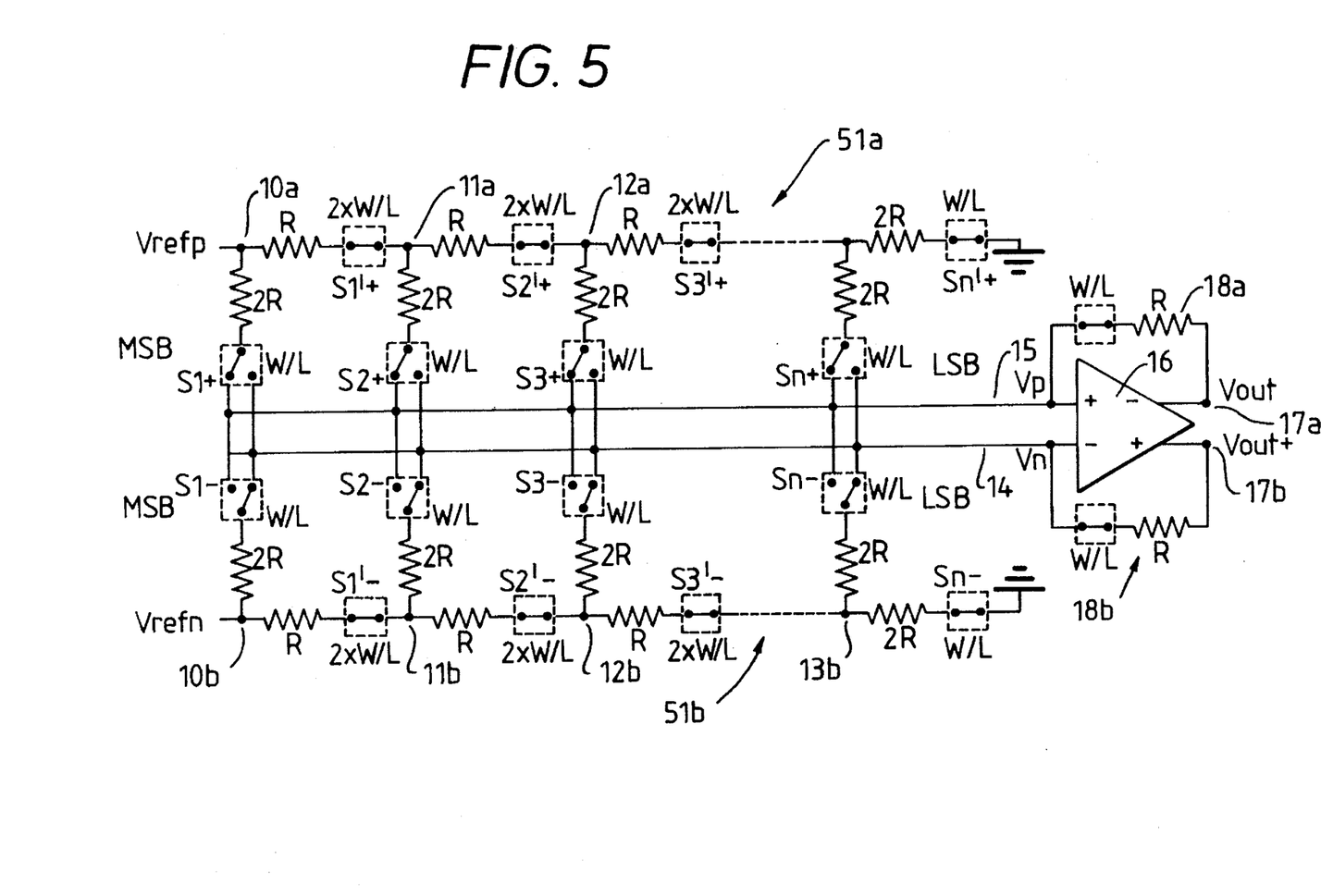
FIG. 5 illustrates one embodiment of a differential R/2R converter according to the invention.

FIG. 5 illustrates therefore a converter in which there are two R/2R ladders disposed symmetrically. A first ladder 51a has its most significant node connected to a positive reference voltage Vrefp and a second, similar R/2R ladder 51b has its input node connected to a negative voltage reference Vrefn. The nodes 14 and 15 are common to the two ladders. For each switch, whether an active switch or a dummy switch, in the ladder 51a there is a switch corresponding in position and function in the ladder 51b. The shunt switches are operable in the same manner by a means 19 (not shown in FIG. 5) from the same digital signal, so that for example the most significant bit thereof controls switches S1+ and S1− in the respective most signification sections of the ladders and so on. The amplifier 16 is a differential amplifier of which the negative and positive output nodes 17a and 17b are coupled by a respective feedback network 18a,18b to the nodes 15 and 14 respectively.

The differential ladder network is easy to implement. Although it occupies more area than a simple ladder converter as shown, for example, in FIG. 3, the extra area need only be caused by the doubling of the passive network because the amplifier 16 would almost certainly need to have a differential configuration in the converter of FIG. 3 in order to provide an appropriate noise immunity. Moreover, the area on the usual silicon chip for the passive components of a ladder network is comparatively very small.

As may be seen from FIG. 5, the number of switches connected, for any value of the input digital signal, to either of the nodes 14 and 15 is constant and is equal to the number of stages in the ladder (n). For any bit position from 1 to n one shunt switch is switched either to positive or to negative and because the ladders can be made a perfect match and by virtue of superposition the resulting equivalent impedances on both the nodes Vp and Vn are constant and equal to the sum of the series resistance R and the resistance of a single switch. Moreover, the output is symmetrical about the mid range voltage, (Vrefp+Vrefn)/2.

A similar result may be obtained by making the nodes 14 and 15 reference nodes and coupling the inputs of output amplifier 16 to the nodes 10a and 10b.

The capacitative loads on the output nodes of digital to analog converters may exhibit stray capacitances due to the drain area and periphery of every switch whether it be on or off. The gate-to-drain capacitance of each switch which is conductive is also a contributing factor. Other factors such as routing capacitance are less important and they can be precisely matched for both nodes using a symmetrical layout. Stray capacitances and gate drain overlap capacitance are present on all switches whether conductive or non conductive and are practically constant. Stray capacitances associated with drains of transistors have a constant value because output nodes are at virtual ground and therefore at a fixed potential.

Gate capacitances introduced by the conductive switches are less important. Switches which are turned off only bring the contribution of their gate-to-drain overlap capacitance which is fixed also. However, a simplified capacitative model for a transistor operating in a linear mode shows that the gate capacitance can be assumed to be distributed equally between source-to-gate capacitance and drain-to-gate capacitance. This contribution is the most important and for the simple digital to analog converter shown in FIG. 3 the values depends upon how many switches are turned on, and is therefore dependent upon the input code. For the differential converter shown in FIG. 5, it is obvious that for either the node Vp or the node Vn there are at any time exactly n switches turned on and exactly n switches turned off and therefore the sum of all stray capacitances of whichever type is constant.

Figure 6:
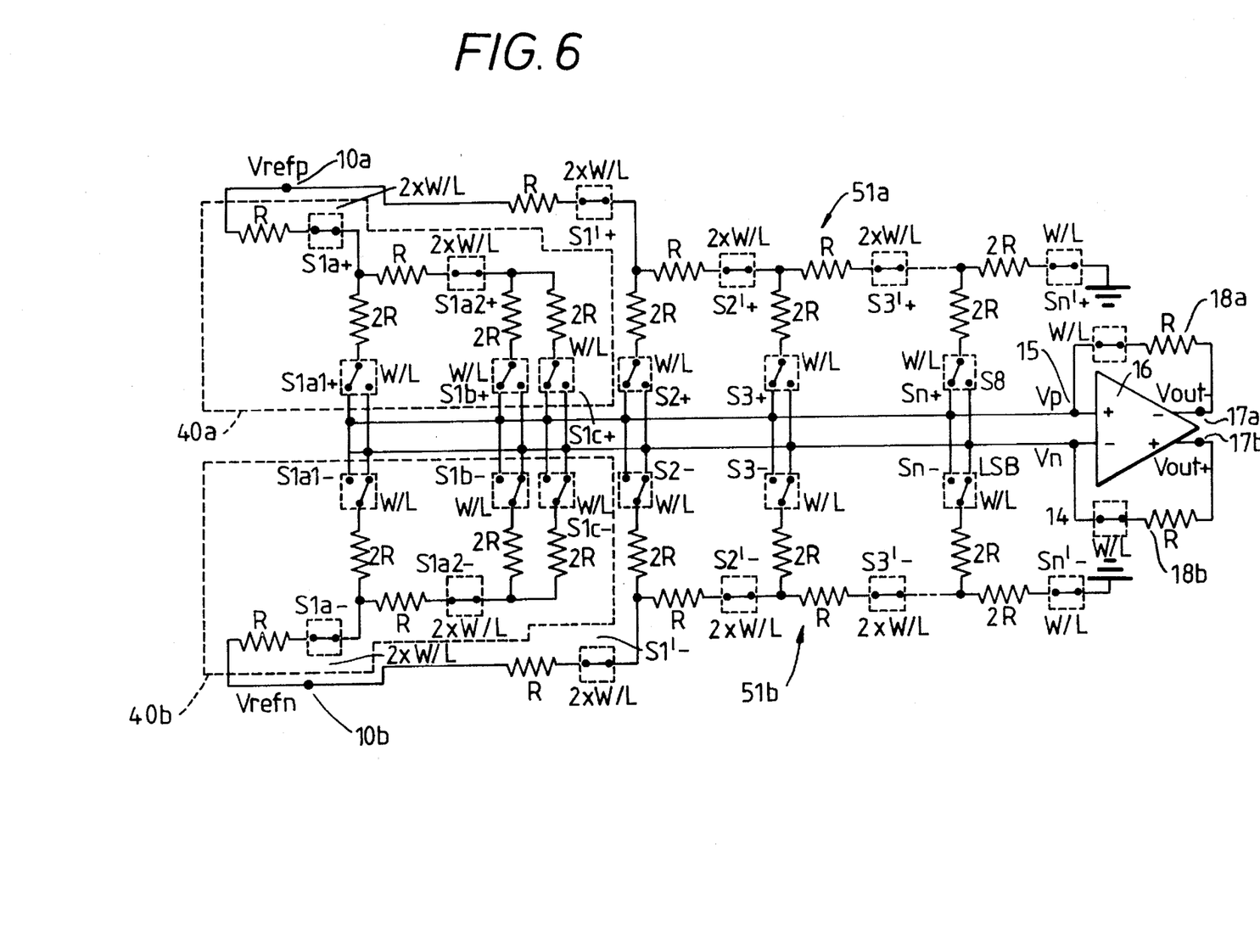
FIG. 6 illustrates another embodiment of a converter according to the invention.

FIG. 6 illustrates another embodiment of the invention. In this Figure, each of the R/2R ladders 51a and 51b of FIG. 5 has been modified by the substitution of the most significant shunt arm by respective equivalent networks 40a and 40b in the manner already fully described with reference to FIG. 4, so that detailed description of FIG. 6 is superfluous.

Figure 7A:
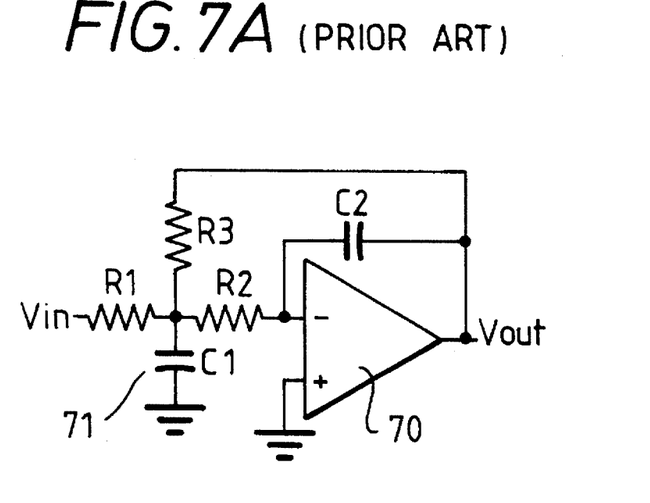
FIGS. 7A and FIG. 7B illustrate the incorporation of a digital to analog converter into a second order filter.
Figure 7B:
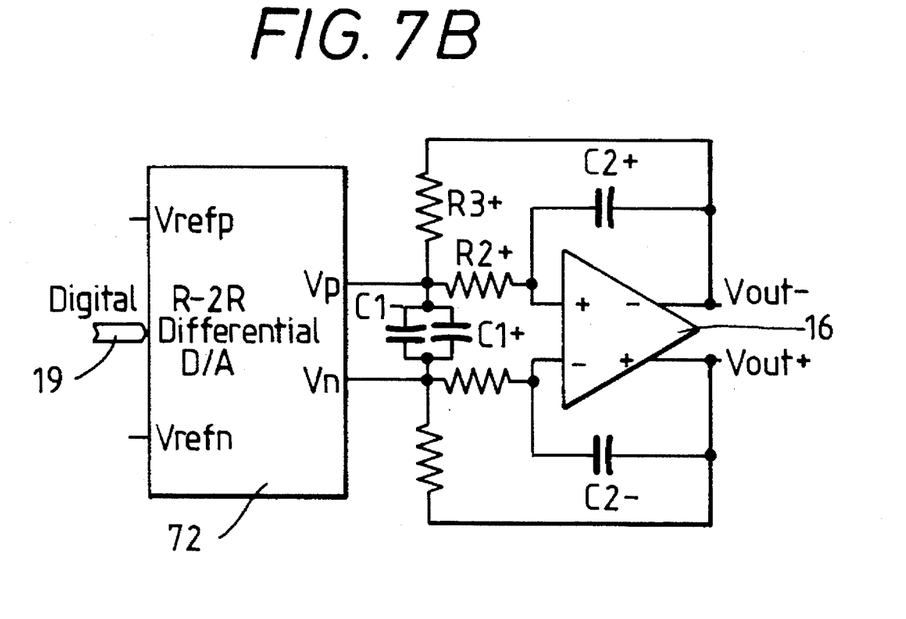

A converter as described with reference to FIG. 5 or FIG. 6 may very conveniently be incorporated into a filter network because the converter has a constant impedance and a constant output capacitance. FIG. 7A shows by way of example a Rauch filter of known type, comprising an operational inverting amplifier 70, an input Tee network 71 comprising series resistors R1 and R2 and shunt capacitor C1, a feedback resistor R3 coupling the output of the amplifier to the junction of the input network and an integrating feedback capacitor C2 for the amplifier 16. FIG. 7B illustrates the filter incorporating a converter 72 as described with reference to FIG. 5 or 6 and including a digital input circuit 19 as previously described. The differential amplifier 16 for the converter is employed in place of the amplifier 70, the ladder networks (of constant impedance) take the place of resistor R1 and the remaining passive components of the filter are duplicated as necessary in a accordance with the symmetrical configuration of the converter.

Various other modifications will become apparent to the skilled reader and all such modifications and equivalents thereof are intended to be within the scope of the invention.

I claim:

1. In a digital-to-analog converter, the combination comprising:

a positive reference node and a negative reference node;

first and second R/2R ladder networks each comprising a multiplicity of series arms extending from a respective one of said reference nodes, and a multiplicity of shunt arms, each shunt arm including operative switch means having a finite switch resistance, each series arm including dummy switch means having a resistance substantially half said switch resistance, said operative switch means being operable to couple, in response to a respective digit of a multiple digit digital signal, a respective shunt arm to one or other of a first node and a second node, said operative switch means of the two networks coupling in response to any value of the digital signal the same muliplicity of shunt arms to each of the first and second nodes; wherein each of said ladder networks extends from a most significant section to a least significant section and wherein each of said ladder networks includes one shunt arm extending between a third node to said first and second nodes and said one shunt arm comprises a ladder section configured as an equivalent of that part of the respective ladder network which extends from said third node towards the least significant section of said each ladder network.

2. The combination set forth in claim 1 wherein said switch means comprise CMOS switches.

3. The combination set forth in claim 1 further comprising a differential amplifier having differential inputs coupled symmetrically to said two ladder networks.

4. The combination set forth in claim 3 wherein said differential inputs are coupled to said first and second nodes.

5. The combination set forth in claim 1 wherein said one shunt arm is the shunt arm of the most significant section of the respective ladder network.

6. In a digital-to-analog converter which includes an R/2R ladder network having a multiplicity of ladder sections extending from a most significant section to a least significant section, and wherein each section comprises a series arm and a shunt arm extending from a respective node, the shunt arm comprising a shunt resistor and an operative switch for coupling the shunt resistor in circuit between a reference voltage node and an output in accordance with a respective digital signal component, the series arm comprising a series resistor having half the resistance of said shunt resistor and a dummy switch configured to have a switch resistance which is half a switch resistance of the operative switch, said switch resistances being variably dependent on applied voltage, the improvement which comprises for at least one of said sections a ladder portion which includes the respective shunt arm and a series portion which corresponds to the respective series arm and is connected to the same respective node as the respective series arm, the ladder portion being a network equivalent to the part of the ladder network which includes said respective series arm and extends from said respective node towards the said least significant section.

7. The improvement set forth in claim 6 wherein said one of said sections is said most significant section.

* * * * *

UNITED STATES PATENT AND TRADEMARK OFFICE
CERTIFICATE OF CORRECTION

PATENT NO. : 5,455,582
DATED : October 3, 1995
INVENTOR(S) : Patrick Valdenaire

It is certified that error appears in the above-indentified patent and that said Letters Patent is hereby corrected as shown below:

On the title page: Item [73] Assignee's, "ULSI Technology, Inc. San Jose, Calif." should read -- VLSI Technology, Inc. San Jose, Calif.

Signed and Sealed this

Twenty-fifth Day of June, 1996

Attest:

BRUCE LEHMAN

*Attesting Officer*     *Commissioner of Patents and Trademarks*